US010297709B2

(12) United States Patent
Fogel et al.

(10) Patent No.: US 10,297,709 B2
(45) Date of Patent: May 21, 2019

(54) PHOTOVOLTAIC DEVICES WITH AN INTERFACIAL BAND-GAP MODIFYING STRUCTURE AND METHODS FOR FORMING THE SAME

(71) Applicants: International Business Machines Corporation, Armonk, NY (US); Egypt Nanotechnology Center, Cairo-Alexandria (EG)

(72) Inventors: Keith E. Fogel, Hopewell Junction, NY (US); Jeehwan Kim, Los Angeles, CA (US); Devendra K. Sadana, Pleasantville, NY (US); George S. Tulevski, White Plains, NY (US); Ahmed Abou-Kandil, Elmsford, NY (US); Hisham S. Mohamed, Clifton Park, NY (US); Mohamed Saad, White Plains, NY (US); Osama Tobail, Elmsford, NY (US)

(73) Assignees: INTERNATIONAL BUSINESS MACHINES CORPORATION, Armonk, NY (US); EGYPT NANOTECHNOLOGY CENTER, Cairo (EG)

( * ) Notice: Subject to any disclaimer, the term of this patent is extended or adjusted under 35 U.S.C. 154(b) by 208 days.

(21) Appl. No.: 15/156,940

(22) Filed: May 17, 2016

(65) Prior Publication Data

US 2016/0260859 A1    Sep. 8, 2016

Related U.S. Application Data

(60) Continuation of application No. 14/218,410, filed on Mar. 18, 2014, now abandoned, which is a division of
(Continued)

(51) Int. Cl.
*H01L 31/0224* (2006.01)
*H01L 31/18* (2006.01)
(Continued)

(52) U.S. Cl.
CPC ........ *H01L 31/1884* (2013.01); *H01L 31/028* (2013.01); *H01L 31/02327* (2013.01);
(Continued)

(58) Field of Classification Search
None
See application file for complete search history.

(56) References Cited

U.S. PATENT DOCUMENTS 4,162,505 A    7/1979   Hanak
4,532,198 A    7/1985   Saitoh et al.
(Continued)

FOREIGN PATENT DOCUMENTS

JP    2002208715 A    7/2002

OTHER PUBLICATIONS

Hu, L. et al., "Percolation in Transparent and Conducting Carbon Nanotube Networks", Nano Letters, vol. 4(12), Oct. 22, 2004, pp. 2513-2517.
(Continued)

*Primary Examiner* — Eli S Mekhlin
(74) *Attorney, Agent, or Firm* — Scully, Scott, Murphy & Presser, P.C.; L. Jeffrey Kelly (57) ABSTRACT

A Schottky-barrier-reducing layer is provided between a p-doped semiconductor layer and a transparent conductive material layer of a photovoltaic device. The Schottky-barrier-reducing layer can be a conductive material layer having a work function that is greater than the work function of the transparent conductive material layer. The conductive material layer can be a carbon-material layer such as a carbon nanotube layer or a graphene layer. Alternately, the
(Continued)

conductive material layer can be another transparent conductive material layer having a greater work function than the transparent conductive material layer. The reduction of the Schottky barrier reduces the contact resistance across the transparent material layer and the p-doped semiconductor layer, thereby reducing the series resistance and increasing the efficiency of the photovoltaic device.

13 Claims, 10 Drawing Sheets

Related U.S. Application Data application No. 12/850,272, filed on Aug. 4, 2010, now abandoned.

(51) Int. Cl.

|  |  |  |
|---|---|---|
| H01L 31/075 | (2012.01) |
| H01L 31/0232 | (2014.01) |
| H01L 31/07 | (2012.01) |
| H01L 31/056 | (2014.01) |
| H01L 31/028 | (2006.01) |
| H01L 31/20 | (2006.01) |
| H01L 31/0256 | (2006.01) |

(52) U.S. Cl.
CPC ............ *H01L 31/022466* (2013.01); *H01L 31/022483* (2013.01); *H01L 31/056* (2014.12); *H01L 31/07* (2013.01); *H01L 31/075* (2013.01); *H01L 31/20* (2013.01); *H01L 2031/0344* (2013.01); *Y02E 10/52* (2013.01); *Y02E 10/548* (2013.01)

(56) References Cited

U.S. PATENT DOCUMENTS

| | | |
|---|---|---|
| 6,040,521 A | 3/2000 | Kushiya et al. |
| 6,077,722 A | 6/2000 | Jansen et al. |
| 6,380,480 B1 | 4/2002 | Norimatsu et al. |
| 6,399,873 B1 | 6/2002 | Sano et al. |
| 2002/0002992 A1 | 1/2002 | Kariya et al. |
| 2003/0213515 A1 | 11/2003 | Sano et al. |
| 2004/0149330 A1* | 8/2004 | Sugiyama ............ H01L 31/076 136/249 |
| 2009/0017211 A1* | 1/2009 | Gruner ................ B82Y 30/00 427/258 |
| 2009/0314350 A1 | 12/2009 | Jung et al. |
| 2009/0320910 A1* | 12/2009 | Matsui ........... H01L 31/022466 136/252 |
| 2010/0028533 A1* | 2/2010 | Bollman .......... H01L 21/02568 427/248.1 |
| 2011/0030772 A1* | 2/2011 | Veerasamy ........... B82Y 30/00 136/256 |
| 2011/0308585 A1 | 12/2011 | Joshi et al. |

OTHER PUBLICATIONS

Mondragon-Suarez, H. et al., "ZnO:Al thin films obtained by chemical spray: effect of the Al concentration", Applied Surface Science, 193, (2002), pp. 52-59.

Elangovan, E. et al., "Optoelectronic properties of spray deposited SnO2:F Thin films for window materials in solar cells", Journal of Optoelectronics and Advanced Materials, vol. 5, No. 1, Mar. 2003, pp. 45-54.

U.S. Office Action dated May 25, 2018 received in a related U.S. Patent Application, namely U.S. Appl. No. 15/229,604.

* cited by examiner

PHOTOVOLTAIC DEVICES WITH AN INTERFACIAL BAND-GAP MODIFYING STRUCTURE AND METHODS FOR FORMING THE SAME

BACKGROUND

The present disclosure relates to photovoltaic devices, and more particularly to photovoltaic devices including an interfacial band-gap modifying structure and methods of forming the same.

A photovoltaic device is a device that converts the energy of incident photons to electromotive force (e.m.f.). Typical photovoltaic devices include solar cells, which are configured to convert the energy in the electromagnetic radiation from the Sun to electric energy. Each photon has an energy given by the formula $E=h\nu$, in which the energy E is equal to the product of the Plank constant h and the frequency $\nu$ of the electromagnetic radiation associated with the photon.

A photon having energy greater than the electron binding energy of a matter can interact with the matter and free an electron from the matter. While the probability of interaction of each photon with each atom is probabilistic, a structure can be built with a sufficient thickness to cause interaction of photons with the structure with high probability. When an electron is knocked off an atom by a photon, the energy of the photon is converted to electrostatic energy and kinetic energy of the electron, the atom, and/or the crystal lattice including the atom. The electron does not need to have sufficient energy to escape the ionized atom. In the case of a material having a band structure, the electron can merely make a transition to a different band in order to absorb the energy from the photon.

The positive charge of the ionized atom can remain localized on the ionized atom, or can be shared in the lattice including the atom. When the positive charge is shared by the entire lattice, thereby becoming a non-localized charge, this charge is described as a hole in a valence band of the lattice including the atom. Likewise, the electron can be non-localized and shared by all atoms in the lattice. This situation occurs in a semiconductor material, and is referred to as photogeneration of an electron-hole pair. The formation of electron-hole pairs and the efficiency of photogeneration depend on the band structure of the irradiated material and the energy of the photon. In case the irradiated material is a semiconductor material, photogeneration occurs when the energy of a photon exceeds the band gap energy, i.e., the energy difference of a band gap of the irradiated material.

The direction of travel of charged particles, i.e., the electrons and holes, in an irradiated material is sufficiently random. Thus, in the absence of any electrical bias, photogeneration of electron-hole pairs merely results in heating of the irradiated material. However, an external field can break the spatial direction of the travel of the charged particles to harness the electrons and holes formed by photogeneration.

One exemplary method of providing an electric field is to form a p-i-n junction around the irradiated material. As negative charges accumulate in the p-doped region and positive charges accumulate in the n-doped region, an electric field is generated from the direction of the n-doped region toward the p-doped region. Electrons generated in the intrinsic region drift towards the n-doped region due to the electric field, and holes generated in the intrinsic region drift towards the p-doped region. Thus, the electron-hole pairs are collected systematically to provide positive charges at the p-doped region and negative charges at the n-doped region. The p-i-n junction forms the core of this type of photovoltaic device, which provides electromotive force that can power any device connected to the positive node at the p-doped region and the negative node at the n-doped region.

SUMMARY

A Schottky-barrier-reducing layer is provided between a p-doped semiconductor layer and a transparent conductive material layer of a photovoltaic device. The Schottky-barrier-reducing layer can be a conductive material layer having a work function that is greater than the work function of the transparent conductive material layer. The conductive material layer can be a carbon-material layer such as a carbon nanotube layer or a graphene layer. Alternately, the conductive material layer can be another transparent conductive material layer having a greater work function than the transparent conductive material layer. The reduction of the Schottky barrier reduces the contact resistance across the transparent material layer and the p-doped semiconductor layer, thereby reducing the series resistance and increasing the efficiency of the photovoltaic device.

According to an aspect of the present disclosure, a photovoltaic device is provided, which includes a stack of a transparent conductive material layer, a Schottky-barrier-reducing layer contacting the transparent conductive material layer, and a p-doped semiconductor layer contacting the p-doped semiconductor layer. The Schottky barrier across the stack has a lower contact resistance than a Schottky barrier across another stack that includes all layers of the stack less the Schottky-barrier-reducing layer.

According to another aspect of the present disclosure, a method of forming a photovoltaic device is provided. The method includes: forming a transparent conductive material layer on a substrate; forming a Schottky-barrier-reducing layer on the transparent conductive material layer; and forming a p-doped semiconductor layer on the Schottky-barrier-reducing layer. The Schottky barrier across a stack of the transparent conductive material layer, the Schottky-barrier-reducing layer, and the p-doped semiconductor layer has less contact resistance than a Schottky barrier across another stack that includes all layers of the stack less the Schottky-barrier-reducing layer.

DETAILED DESCRIPTION

As stated above, the present disclosure relates to photovoltaic devices including an interfacial band-gap modifying structure and methods of forming the same, which are now described in detail with accompanying figures. Throughout the drawings, the same reference numerals or letters are used to designate like or equivalent elements. The drawings are not necessarily drawn to scale.

As used herein, a crystal structure is "microcrystalline" if the average grain size of the material is from 1 nm to 10 microns.

As used herein, a "hydrogenated" semiconductor material is a semiconductor material including incorporated hydrogen therein, which neutralizes dangling bonds in the semiconductor material and allows charge carriers to flow more freely.

As used herein, a "semiconductor-material-containing reactant gas" refers to a gas including at least one atom of Si, Ge, or components of a compound semiconductor material.

As used herein, an element is "optically transparent" if the element is transparent in the visible electromagnetic spectral range having a wavelength from 400 nm to 800 nm.

As used herein, a "Schottky-barrier-reducing" element is an element that is located between two other elements that form a Schottky barrier, in which the presence of the Schottky-barrier-reducing element reduces a contact resistance of a structure including the two other elements and the Schottky-barrier-reducing element relative a structure including only the two other elements.

Figure 1:
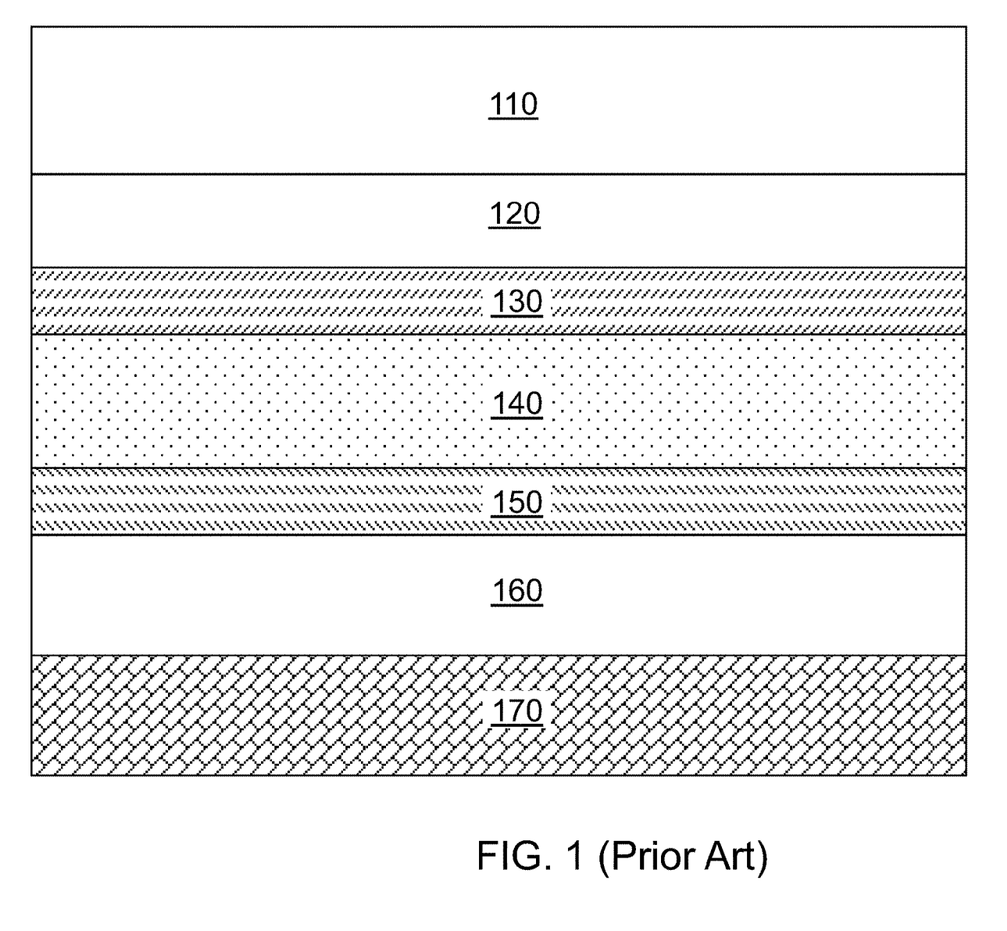
FIG. 1 is a vertical cross-sectional view of a prior art photovoltaic device structure.

Referring to FIG. 1, a prior art photovoltaic device structure includes a material stack, from top to bottom, of a substrate 110, a transparent conductive material layer 120, a p-doped semiconductor layer 130, an intrinsic semiconductor layer 140, an n-doped semiconductor layer 150, a first back reflector layer 160, and a second back reflector layer 170. The substrate 110 typically includes an optically transparent material. The transparent conductive material layer 120 functions as a positive node of the prior art photovoltaic device, and the combination of the second back reflector layer 170 functions as a negative node of the prior art photovoltaic device. The first back reflector layer 160 can be optically transparent, and the combination of the first and second back reflector layers (160, 170) reflect any photons that pass through the stack of the p-doped semiconductor layer 130, the intrinsic semiconductor layer 140, and the n-doped semiconductor layer 150 to enhance the efficiency of the prior art photovoltaic device.

The p-doped semiconductor layer 130 can include an amorphous p-doped hydrogenated silicon-containing material or microcrystalline p-doped hydrogenated silicon-containing material. The amorphous p-doped hydrogenated silicon-containing material or the microcrystalline p-doped hydrogenated silicon-containing material can be deposited by flowing a semiconductor-material-containing reactant in hydrogen carrier gas. In this case, hydrogen atoms are incorporated in the deposited material of the p-doped semiconductor layer 130. The p-doped semiconductor layer 130 can include an amorphous p-doped hydrogenated silicon-carbon alloy or a microcrystalline p-doped hydrogenated silicon-carbon alloy.

Figure 2:
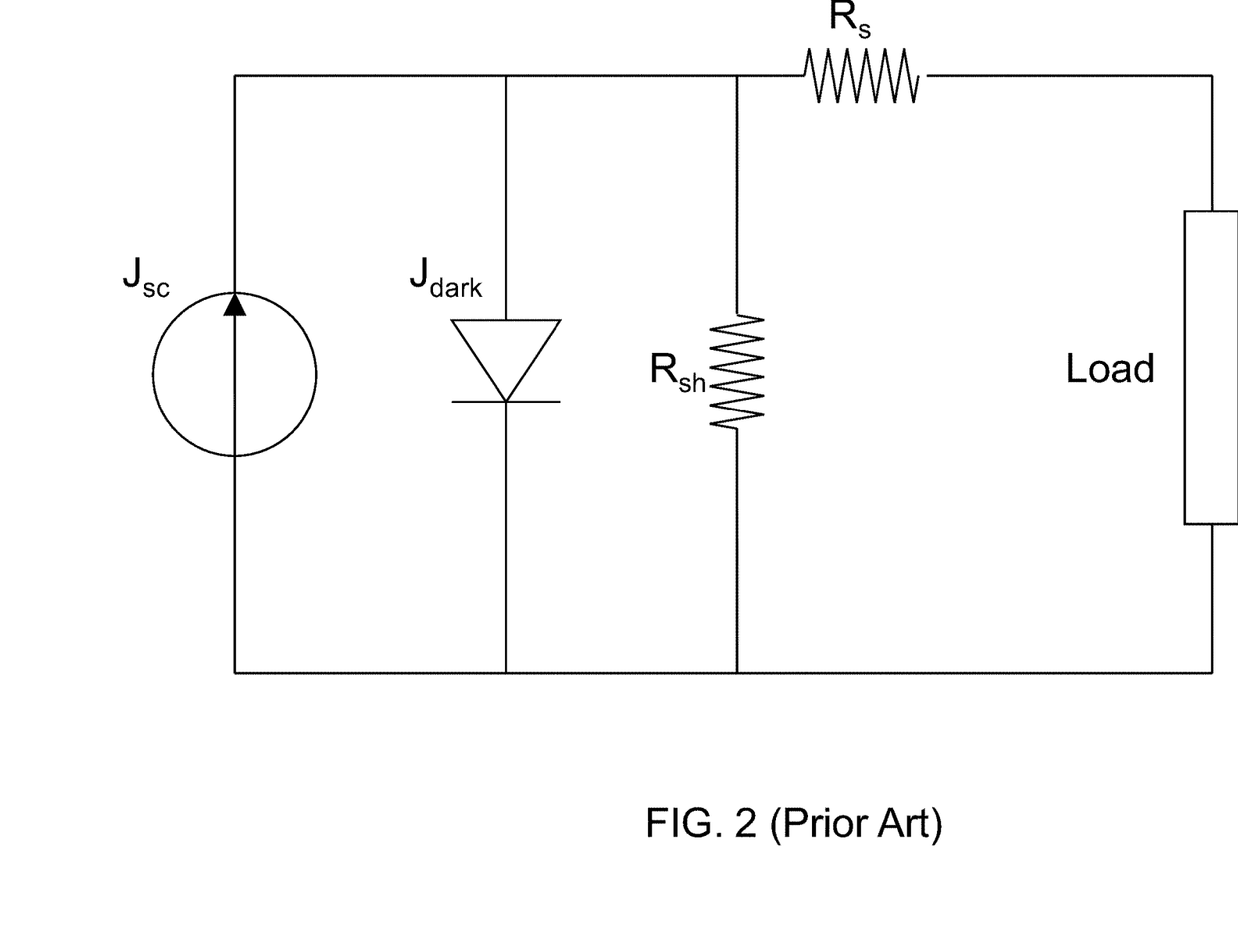
FIG. 2 is an equivalent circuit for the prior art photovoltaic device structure of FIG. 1.

Referring to FIG. 2, the functionality of the prior art photovoltaic device of FIG. 1 can be approximated by an equivalent circuit that includes a current source, a diode, and two resistors. The equivalent circuit of FIG. 2 approximates a unit area of the prior art photovoltaic device of FIG. 1, which provides electrical current that is proportional to the total irradiated area of the prior art photovoltaic device. The photovoltaic current per unit area generated by the prior art photovoltaic device is referred to as a short-circuit current density $J_{sc}$, i.e., the current density generated by the prior art photovoltaic device if the positive node and the negative node of the prior art photovoltaic device are electrically shorted. Thus, the current source in FIG. 2 generates an electrical current with a current density of the short-circuit current density $J_{sc}$.

Power dissipation through internal leakage current is approximated by a shunt resistance $R_{sh}$. A finite value for the shunt resistance $R_{sh}$ triggers an internal leakage current through the prior art photovoltaic device of FIG. 1, and degrades the performance of the prior art photovoltaic device. The lesser the shunt resistance $R_{sh}$, the greater is the internal power loss due to the internal leakage current.

Power dissipation through internal resistance of the prior art photovoltaic device of FIG. 1 is approximated by a series resistance $R_s$. A non-zero value for the series resistance $R_s$ triggers Joule loss within the prior art photovoltaic device. The greater the series resistance $R_s$, the greater is the internal power loss due to the internal resistance of the prior art photovoltaic device.

Referring back to FIG. 1, a predominant portion of the series resistance $R_s$ is the resistance of a Schottky barrier at the interface between the transparent conductive material layer 120 and the p-doped semiconductor layer 130. The Schottky barrier dominates the total value of the series resistance $R_s$ unless significant defects in conductive components, e.g., the transparent conductive material layer 120 or the first and second back reflector layers (160, 170), causes the series resistance $R_s$ to increase abnormally. Thus, in well-functioning prior art photovoltaic devices of FIG. 1, the series resistance $R_s$ is limited by the resistance introduced by the Schottky barrier at the interface between the transparent conductive material layer 120 and the p-doped semiconductor layer 130. In case amorphous hydrogenated carbon-containing silicon alloy is employed for the p-doped semiconductor layer 130, the series resistance $R_s$ of the prior art photovoltaic device of FIG. 1 is from 20 Ohms-cm$^2$ to 30 Ohms-cm$^2$. In case microcrystalline hydrogenated carbon-containing silicon alloy is employed for the p-doped semiconductor layer 130, the series resistance $R_s$ of the prior art photovoltaic device of FIG. 1 is from 10 Ohms-cm$^2$ to 15 Ohms-cm$^2$.

The potential difference between the positive node, i.e., the p-doped semiconductor layer 130, and the negative node, i.e., the n-doped semiconductor layer 150, generates an internal current that flow in the opposite direction to the photocurrent, i.e., the current represented by the current source having the short-circuit current density $J_{sc}$. The dark current has the same functional dependence on the voltage across the current source as a diode current. Thus, the dark current is approximated by a diode that allows a reverse-direction current. The density of the dark current, i.e., the dark current per unit area of the prior art photovoltaic device, is referred to as the dark current density $J_{dark}$. An external load can be attached to an outer node of the series resistor and one of the nodes of the current source. In FIG. 2, the value the impedance of the load is the value of the actual impedance of a physical load is divided by the area of the prior art photovoltaic cell because the equivalent circuit of FIG. 2 describes the functionality of a unit area of the prior art photovoltaic cell.

Figure 3:
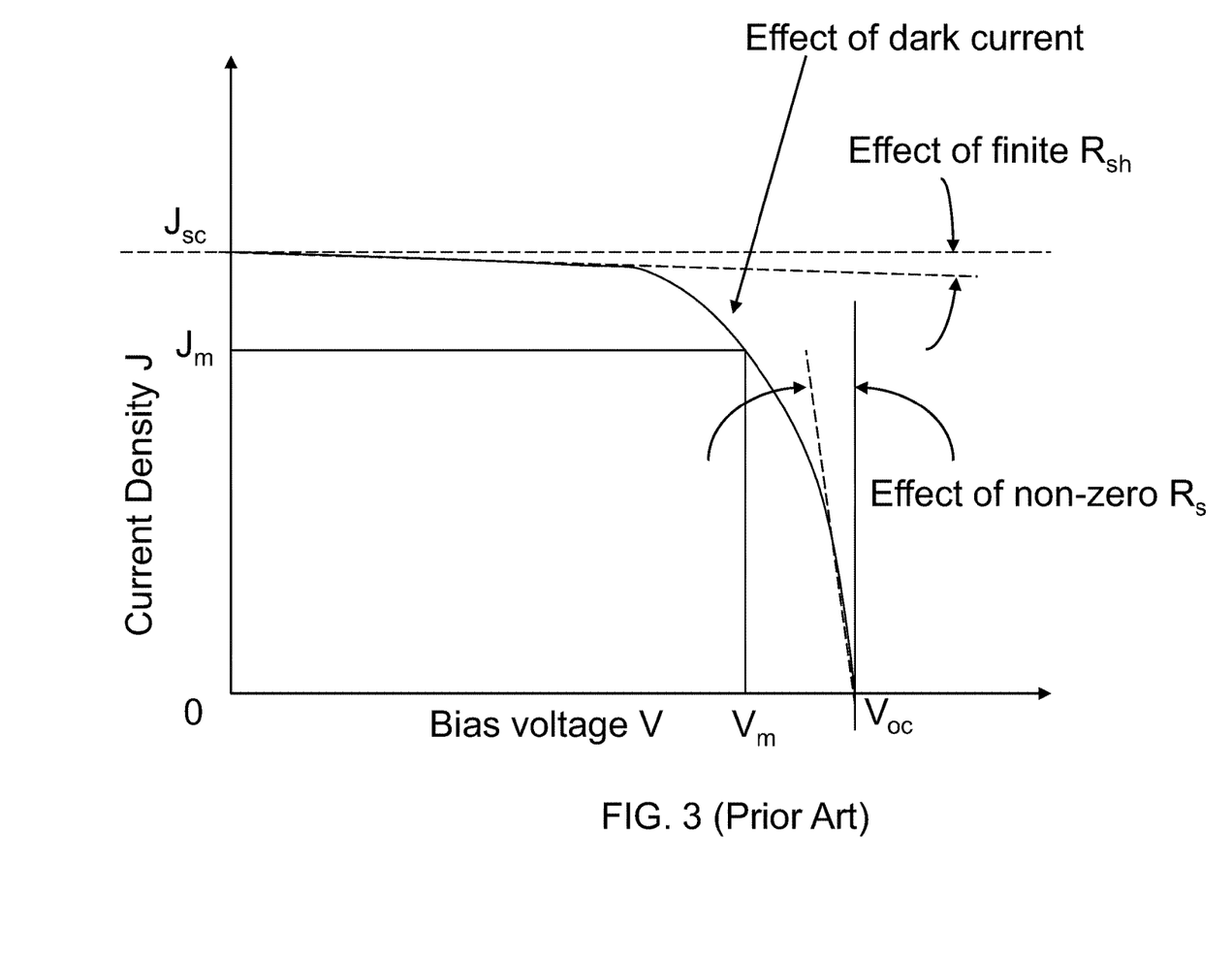
FIG. 3 is a schematic graph of an I-V curve of the prior art photovoltaic device structure of FIG. 1.

Referring to FIG. 3, a schematic graph of an I-V curve of the prior art photovoltaic device structure of FIG. 1 is shown. The bias voltage V is the voltage across the load in the equivalent circuit of FIG. 2. The open circuit voltage Voc corresponds to the voltage across the load as the resistance of the load diverges to infinity, i.e., the voltage across the current source when the load is disconnected. The inverse of the absolute value of the slope of the I-V curve at V=0 and $J=J_{sc}$ is approximately equal to the value of the shunt resistance $R_{sh}$. The inverse of the absolute value of the slope of the I-V curve at $V=V_{oc}$ and J=0 is approximately equal to the value of the series resistance $R_s$. The effect of the dark current is shown as an exponential decrease in the current density J as a function of the bias voltage V around a non-zero value of the bias voltage.

The operating range of a photovoltaic device is the portion of the I-V curve in the first quadrant, i.e., when both the bias voltage V and the current density J are positive. The power density P, i.e., the density of power generated from an unit area of the prior art photovoltaic device of FIG. 1, is proportional to the product of the voltage V and the current density J along the I-V curve. The power density P reaches a maximum at a maximum power point of the I-V curve, which has the bias voltage of $V_m$ and the current density of $J_m$. The fill factor FF is defined by the following formula:

$$FF = \frac{J_m \times V_m}{J_{sc} \times V_{oc}}. \quad \text{(Eq. 1)}$$

The fill factor FF defines the degree by which the I-V curve of FIG. 3 approximates a rectangle. The fill factor FF is affected by the series resistance $R_s$ and the shunt resistance $R_{sh}$. The smaller the series resistance $R_s$, the greater the fill factor FF. The greater the shunt resistance $R_{sh}$, the greater the fill factor FF. The theoretical maximum for the fill factor is 1.0.

The efficiency η of a photovoltaic device is the ratio of the power density at the maximum power point to the incident light power density $P_s$. In other words, the efficiency η is given by:

$$\eta = \frac{J_m \times V_m}{P_s}. \quad \text{(Eq. 2)}$$

Eq. 2 can be rewritten as:

$$\eta = \frac{J_{sc} \times V_{oc} \times FF}{P_s}. \quad \text{(Eq. 3)}$$

Thus, the efficiency h of a photovoltaic device is proportional to the short circuit current density $J_{sc}$, the open circuit voltage $V_{oc}$, and the fill factor FF.

The efficiency η of a photovoltaic device depends on the spectral composition of the incident light. For solar cells, the efficiency is calculated under a standard radiation condition defined as 1 sun, which employs the spectrum of the sunlight.

Figure 4:
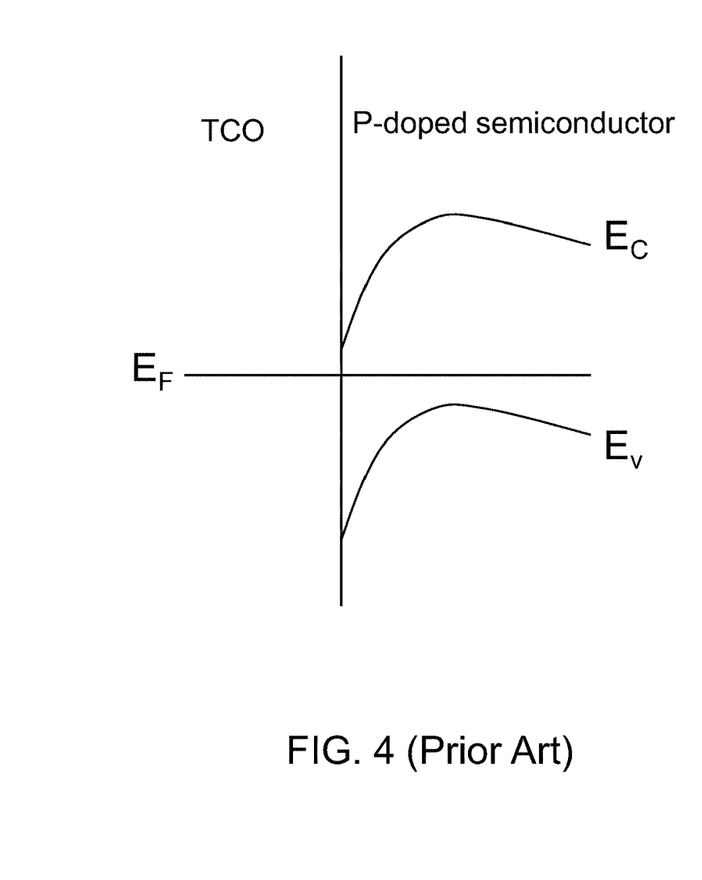
FIG. 4 is a band diagram of a transparent conductive material layer and a p-doped semiconductor layer in the prior art photovoltaic device structure of FIG. 1.

Referring to FIG. 4, a band diagram illustrates the band bending in the p-doped semiconductor layer 130 in the prior art photovoltaic device structure of FIG. 1 due to the transparent conductive material layer 120. Materials currently available for the transparent conductive material layer 120 are n-type materials. A Schottky barrier exits at the interface between the transparent conductive material layer 120 and the p-doped semiconductor layer 130. The valence band and the conduction band of the p-doped semiconductor layer 130 bend downward at the interface between the transparent conductive material layer 120 and the p-doped semiconductor layer 130.

In case the transparent conductive material layer 120 is an aluminum-doped zinc oxide, the work function of the transparent conductive material layer 120 is about 4.5 eV. In other words, the Fermi level $E_F$ is at 4.5 eV below the vacuum level. Other typical materials for the transparent conductive material layer 120 also have a work function of about 4.5 eV.

In case the p-doped semiconductor layer 130 includes an amorphous hydrogenated silicon carbon alloy, the band gap of the p-doped semiconductor layer 130 is around 1.85 eV. The difference between the Fermi level and the valence band of the amorphous hydrogenated silicon carbon alloy is about 1.0 eV. This is a significant energy barrier, and is the cause of the predominant component of the series resistance $R_s$ from 20 Ohms-cm² to 30 Ohms-cm² in the prior art photovoltaic device of FIG. 1.

Figure 5:
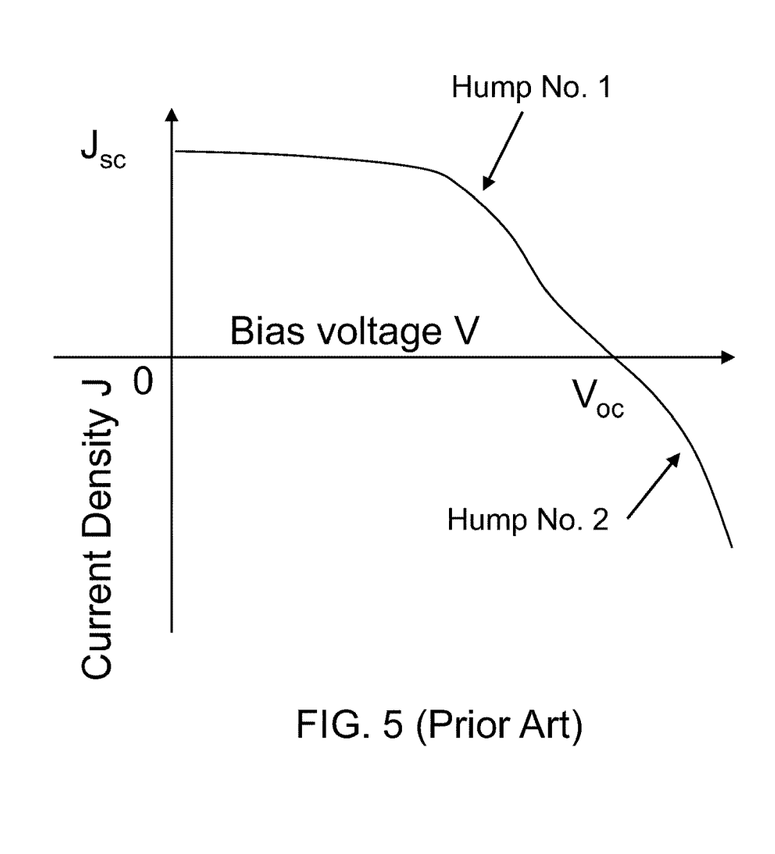
FIG. 5 is a graph of an I-V curve for an exemplary prior art photovoltaic device structure.

Referring to FIG. 5, the significant series resistance $R_s$ in the prior art photovoltaic device of FIG. 1 can be manifested as humps in an I-V curve in case the p-doped semiconductor layer 130 includes an amorphous hydrogenated silicon carbon alloy. The portion of the I-V curve in the fourth quadrant can be obtained by applying an external voltage across the positive and negative terminals of the prior art photovoltaic device of FIG. 1. The hump in the first quadrant can adversely affect the fill factor FF, and consequently affect the efficiency η adversely.

Figure 6:
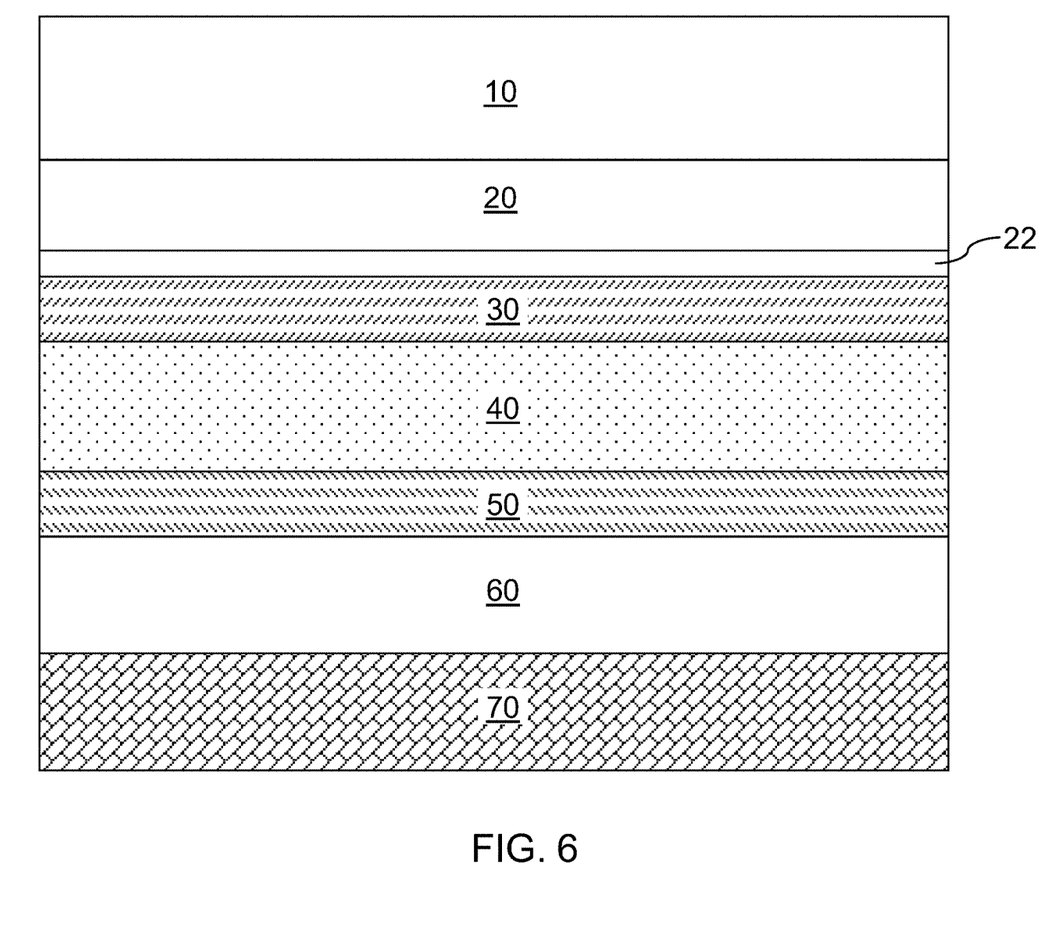
FIG. 6 is a vertical cross-sectional view of an exemplary photovoltaic device structure according to various embodiments of the present disclosure.

FIG. 6 is a vertical cross-sectional view of an exemplary photovoltaic device structure according to various embodiments of the present disclosure. The photovoltaic device structure includes a material stack, from top to bottom, of a substrate 10, a transparent conductive material layer 20, a Schottky-barrier-reducing layer 22, a p-doped semiconductor layer 30, an intrinsic semiconductor layer 40, an n-doped semiconductor layer 50, a first back reflector layer 60, and a second back reflector layer 70.

The substrate 10 is a structure that provides mechanical support to the photovoltaic structure. The substrate 10 is transparent in the range of electromagnetic radiation at which photogeneration of electrons and holes occur within the photovoltaic structure. If the prior art photovoltaic device is a solar cell, the substrate 10 can be optically transparent. The substrate 10 can be a glass substrate. The thickness of the substrate 10 can be from 50 microns to 3 mm, although lesser and greater thicknesses can also be employed.

The transparent conductive material layer 20 includes a material that is transparent in the range of electromagnetic radiation at which photogeneration of electrons and holes occur within the photovoltaic device structure. If the photovoltaic device structure is employed as a solar cell, the transparent conductive material layer 20 can be optically transparent. For example, the transparent conductive material layer 20 can include a transparent conductive oxide such as a fluorine-doped tin oxide ($SnO_2$:F), an aluminum-doped zinc oxide (ZnO:Al), or indium tin oxide. The thickness of the transparent conductive material layer 20 can be from 300 nm to 3 microns, although lesser and greater thicknesses can also be employed.

The Schottky-barrier-reducing layer 22 includes a material that reduces the Schottky barrier through the stack of the transparent conductive material layer 20, the Schottky-barrier-reducing layer 22, and the p-doped semiconductor layer 30 relative a stack (not shown) consisting of a first layer that is the same as the transparent conductive material layer 20 and a second layer that is the same as the p-doped semiconductor layer 30. Thus, the presence of the Schottky-barrier-reducing layer 22 reduces the Schottky barrier of the stack of the transparent conductive material layer 20, the Schottky-barrier-reducing layer 22, and the p-doped semiconductor layer 30 relative to the stack consisting of the first layer and the second layer. Correspondingly, the contact resistance through the stack of the transparent conductive material layer 20, the Schottky-barrier-reducing layer 22, and the p-doped semiconductor layer 30 is less than the contact resistance of the stack consisting of the first layer and the second layer. In other words, the Schottky barrier across the stack of the transparent conductive material layer 20, the Schottky-barrier-reducing layer 22, and the p-doped semiconductor layer 30 has lower contact resistance than a Schottky barrier across another stack that includes all layers of the stack less the Schottky-barrier-reducing layer 22. The various embodiments of the present disclosure differ by the composition of the material in the Schottky-barrier-reducing layer 22.

According to a first embodiment, the Schottky-barrier inducing layer 22 is an optically transparent layer including an allotrope of carbon. In this embodiment, the exemplary photovoltaic device structure is referred to as a first exemplary photovoltaic device structure. In one case, the Schottky-barrier-reducing layer 22 can be a single wall carbon nanotube layer. A carbon nanotube is an allotrope of carbon with a cylindrical nanostructure. A single wall carbon nanotube is a carbon nanotube that does not contain any other carbon nanotube therein, and is not contained in another carbon nanotube. Thus, a single wall carbon nanotube is a single strand of carbon nanotube that stands alone by itself without including, or being included in, another carbon nanotube. The cylindrical arrangement of carbon atoms in a single wall carbon nanotube provides novel properties that make the carbon nanotube potentially useful in many applications. The diameter of a single wall carbon nanotube is on the order of a few nanometers, while the length of the single wall carbon nanotube can be from tens of nanometers to tens of centimeters. The chemical bonding of a single wall carbon nanotube is composed entirely of sp2 bonds, similar to the bonding of graphite. This bonding structure is stronger than the sp3 bonds found in diamonds, providing the single wall carbon nanotube with their unique strength. The single wall carbon nanotube has a work function on the order of 5 eV, which is greater than the work function of most transparent conductive material employed for photovoltaic devices.

In another case, the Schottky-barrier-reducing layer 22 can be a graphene layer. Graphene is a structure consisting of carbon as a two-dimensional sheet. A graphene monolayer has a thickness of about 0.34 nm, i.e., which is approximately the atomic diameter of a single carbon atom. A graphene layer can exist as a monolayer of a two-dimensional material. Alternately, a graphene layer can exist as a stack of a plurality of two-dimensional monolayers of carbon, which do not exceed more than 10 monolayers and is typically limited to less than 5 monolayers. Graphene provides excellent in-plane conductivity. Semiconductor devices employing graphene have been suggested in the art to provide high-density and high-switching-speed semiconductor circuits. Carbon atoms are arranged in a two-dimensional honeycomb crystal lattice in which each carbon-carbon bond has a length of about 0.142 nm.

According to a second embodiment, the Schottky-barrier-reducing layer 22 includes a same material as the transparent conductive material layer 20. However, the Schottky-barrier-reducing layer 22 has a different doping than the transparent conductive material layer. The difference in the doping between the transparent conductive material layer 20 and the Schottky-barrier-reducing layer 22 is set such that the presence of the Schottky-barrier-reducing layer 22 reduces the Schottky barrier between the transparent conductive material layer 20 and the p-doped semiconductor layer 30. In this embodiment, the exemplary photovoltaic device structure is referred to as a second exemplary photovoltaic device structure.

In one case, the transparent conductive material layer 20 includes an aluminum-doped zinc oxide having an aluminum doping at a first dopant concentration, and the Schottky-barrier-reducing layer 22 includes an aluminum-doped zinc oxide having an aluminum doping at a second dopant concentration. In this case, the first dopant concentration is greater than the second dopant concentration.

In another case, the transparent conductive material layer 20 includes a first fluorine-doped tin oxide having a fluorine doping at a first dopant concentration, and the Schottky-barrier-reducing layer 22 includes a second fluorine-doped tin oxide having a fluorine doping at a second dopant concentration. In this case, the first dopant concentration is greater than the second dopant concentration.

The p-doped semiconductor layer 30 includes an amorphous or microcrystalline p-doped semiconductor-containing material. In some cases, the p-doped semiconductor layer 30 can include a hydrogenated amorphous or microcrystalline p-doped semiconductor-containing material. The presence of hydrogen in the p-doped semiconductor layer 30 can increase the concentration of free charge carriers, i.e., holes, by delocalizing the electrical charges that are pinned to defect sites.

A hydrogenated p-doped semiconductor-containing material can be deposited in a process chamber containing a semiconductor-material-containing reactant gas a carrier gas. To facilitate incorporation of hydrogen in the hydrogenated p-doped semiconductor-containing material, a carrier gas including hydrogen can be employed. Hydrogen atoms in the hydrogen gas within the carrier gas are incorporated into the deposited material to form an amorphous or microcrystalline hydrogenated p-doped semiconductor-containing material of the p-doped semiconductor layer 30. The thickness of the p-doped semiconductor layer 30 can be from 3 nm to 30 nm, although lesser and greater thicknesses can also be employed.

The p-doped semiconductor layer 30 can include a silicon-containing material, a germanium-containing material, or a compound semiconductor material. In one embodiment, the p-doped semiconductor layer 30 includes a silicon-containing material. The microcrystalline p-doped hydrogenated semiconductor-containing material can be a microcrystalline p-doped hydrogenated silicon-carbon alloy. In this case, a carbon-containing gas can be flown into the processing chamber during deposition of the microcrystalline p-doped hydrogenated silicon-carbon alloy. The atomic concentration of carbon in the microcrystalline p-doped hydrogenated silicon-carbon alloy of the p-doped semiconductor layer can be from 1% to 90%, and preferably from 10% to 70%. In this case, the band gap of the p-doped semiconductor layer 30 can be from 1.7 eV to 2.1 eV.

The intrinsic semiconductor layer 40 includes an intrinsic hydrogenated semiconductor-containing material. The intrinsic hydrogenated semiconductor-containing material is deposited in a process chamber containing a semiconductor-material-containing reactant gas a carrier gas including hydrogen. Hydrogen atoms in the hydrogen gas within the carrier gas are incorporated into the deposited material to form the intrinsic hydrogenated semiconductor-containing material of the intrinsic semiconductor layer 40. The intrinsic hydrogenated semiconductor-containing material can be amorphous or microcrystalline. Typically, the intrinsic hydrogenated semiconductor-containing material is amorphous. The thickness of the intrinsic semiconductor layer 40 depends on the diffusion length of electrons and holes in the intrinsic hydrogenated semiconductor-containing material. Typically, the thickness of the intrinsic semiconductor layer 40 is from 100 nm to 1 micron, although lesser and greater thicknesses can also be employed.

The intrinsic semiconductor layer 40 can include a silicon-containing material, a germanium-containing material, or a compound semiconductor material. In one embodiment, the intrinsic semiconductor layer 40 includes a silicon-containing material. The semiconductor material of the intrinsic semiconductor layer 40 can be amorphous intrinsic silicon.

The n-doped semiconductor layer 50 includes an n-doped semiconductor-containing material. The n-doped semiconductor layer 50 can be a hydrogenated material, in which case an n-doped hydrogenated semiconductor-containing material is deposited in a process chamber containing a semiconductor-material-containing reactant gas a carrier gas including hydrogen. The n-type dopants in the n-doped semiconductor layer 50 can be introduced by in-situ doping. Alternately, the n-type dopants in the n-doped semiconductor layer 50 can be introduced by subsequent introduction of dopants employing any method known in the art. The n-doped semiconductor layer 50 can be amorphous or microcrystalline. The thickness of the n-doped semiconductor layer 50 can be from 6 nm to 60 nm, although lesser and greater thicknesses can also be employed.

The n-doped semiconductor layer 50 can include a silicon-containing material, a germanium-containing material, or a compound semiconductor material. In one embodiment, the n-doped semiconductor layer 50 includes a silicon-containing material. The semiconductor material of the n-doped semiconductor layer 50 can be amorphous n-doped silicon.

The first back reflector layer 60 includes a transparent conductive material that is transparent in the range of electromagnetic radiation at which photogeneration of electrons and holes occur within the photovoltaic device structure. If the photovoltaic device structure is employed as a solar cell, the first back reflector layer 60 can be optically transparent. For example, the first back reflector layer 60 can include a transparent conductive oxide such as a fluorine-doped tin oxide ($SnO_2$:F), an aluminum-doped zinc oxide (ZnO:Al), or indium tin oxide. Since such transparent conductive oxide materials are n-type materials, the contact between the first back reflector layer 60 and the n-doped semiconductor layer 50 is Ohmic, and as such, the contact resistance between the first back reflector layer 60 and the n-doped semiconductor layer 50 is negligible. The thickness of the back reflector layer 60 can be from 25 nm to 250 nm, although lesser and greater thicknesses can also be employed.

The second back reflector layer 70 includes a metallic material. Preferably, the metallic material has a high reflectivity in the range of electromagnetic radiation at which photogeneration of electrons and holes occur within the photovoltaic device structure. The metallic material can include silver, aluminum, or an alloy thereof. The thickness of the second back reflector layer 70 can be from 100 nm to 1 micron, although lesser and greater thicknesses can also be employed.

Because the resistance due to the Schottky barrier between the transparent conductive material layer 20 and the p-doped semiconductor layer 30 is the predominant component of a series resistance in properly constructed (i.e., non-defective) photovoltaic devices, the reduction of the Schottky barrier results in a dramatic reduction in the series resistance in the exemplary photovoltaic device structure according to the present disclosure compared to prior art photovoltaic device structures. For example, while the prior art photovoltaic device structure of FIG. 1 has a series resistance from 20 Ohms-$cm^2$ to 30 Ohms-$cm^2$ if an amorphous hydrogenated carbon-containing silicon alloy is employed for a p-doped semiconductor layer 130, or has a series resistance from 10 Ohms-$cm^2$ to 15 Ohms-$cm^2$ if a microcrystalline hydrogenated carbon-containing silicon alloy is employed for the p-doped semiconductor layer 130, photovoltaic device structures according to the present disclosure can have a series resistance less than 9 Ohms-$cm^2$. Various samples of photovoltaic device structures according to the various embodiments of the present disclosure demonstrated a series resistance from 4 Ohms-$cm^2$ to 9 Ohms-$cm^2$.

Figure 7:
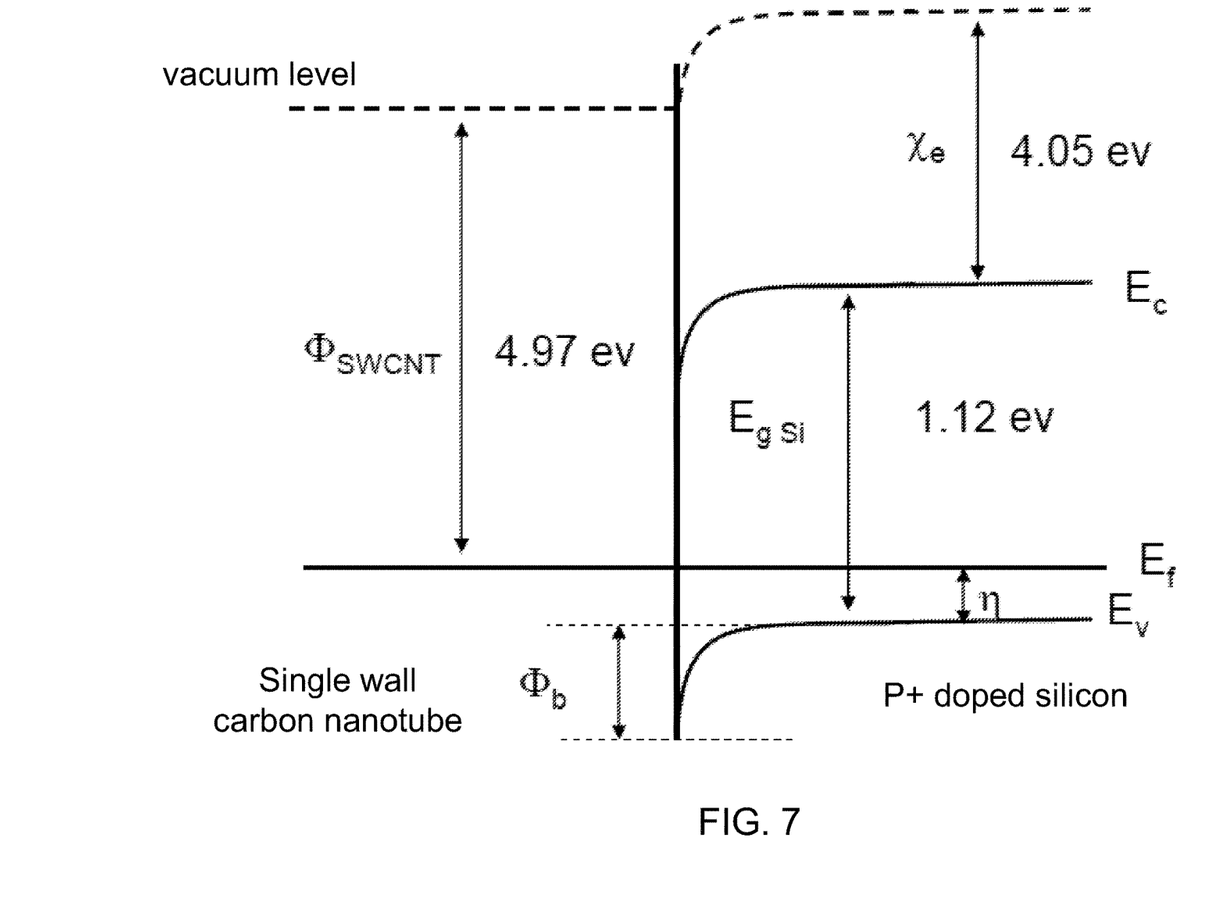
FIG. 7 is a band diagram of a junction of a single wall carbon nanotube and a p-doped silicon material according to the first embodiment of the present disclosure.

Referring to FIG. 7, a graph illustrates the J-V characteristics of a junction of single wall carbon nanotubes and a p-doped silicon material according to the first embodiment of the present disclosure. The J-V characteristics of the junction of the single wall carbon nanotube and a p-doped silicon material approximate the J-V characteristics of the junction between the Schottky-barrier-reducing layer 22 and the p-doped semiconductor layer 30 within the first exemplary photovoltaic device structure for the case in which the Schottky-barrier-reducing layer 22 includes a layer of single wall carbon nanotubes and the p-doped semiconductor layer 30 includes the p-doped silicon material. The J-V characteristics show a diode forward voltage drop of about 0.1V and an estimated internal resistance of about 2 Ohms-$cm^2$. The J-V characteristics illustrate a lower contact resistance between the Schottky-barrier-reducing layer 22 and the p-doped semiconductor layer 30 than the contact resistance between any transparent conductive material layer known in the art and a p-doped semiconductor layer known in the art.

Referring to FIG. 7, a band diagram of a junction of a single wall carbon nanotube and a p-doped silicon layer illustrates the mechanism for the reduction in the contact resistance between the Schottky-barrier-reducing layer 22 and the p-doped semiconductor layer 30 according to the first embodiment of the present disclosure. The band bending $\Phi_b$ in the p-doped semiconductor layer 30 is the same irrespective of any selected energy level, i.e., the amount of band bending the same for the vacuum level, for the valence band $E_v$, and for the conduction band $E_c$. The various energy gaps between different energy levels in the band diagram are related by the following equations:

$$\eta = E_F - E_v \approx 0 \quad \text{(Eq. 1)}$$

$$\Phi_{SWCNT} + \eta + \Phi_b = \chi_e + E_{g\,Si} \quad \text{(Eq. 2)}$$

$$\Phi_{SWCNT} = 4.97 \text{ eV} \quad \text{(Eq. 3)}$$

$$\chi_e = 4.05 \text{ eV} \quad \text{(Eq. 4)}$$

$$E_{g\,Si} = 1.12 \text{ eV} \quad \text{(Eq. 5)}$$

Solving the above equations, the value of band bending $\Phi_b$ is 0.2 eV, which is substantially smaller than an equivalent band bending of about 0.7 eV at an interface between a typical transparent conductive material and a p-doped silicon material. The smaller band bending at the interface between Schottky-barrier-reducing layer 22 and the p-doped semiconductor layer 30 reduces the Schottky barrier, and consequently the accompanying contact resistance, compared with a Schottky barrier between a transparent conductive material and a p-doped silicon material.

Single wall carbon nanotubes are transparent. See, for example, Hu et al., "Percolation in Transparent and Conducting Carbon Nanotube Networks," Nanoletters, 2004, Vol. 4, No. 12, pp. 2513-2517.

Figure 8:
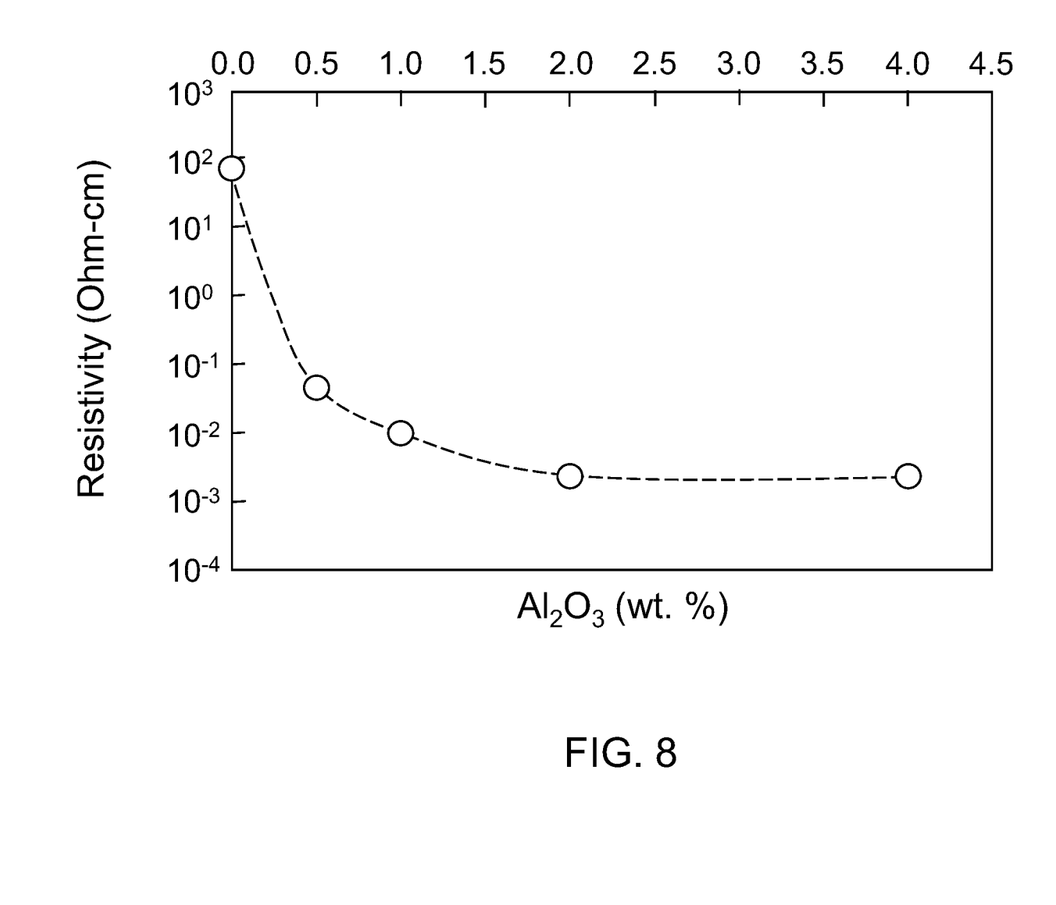
FIG. 8 is a graph illustrating the resistivity of aluminum-doped zinc oxide as a function of weight percentage of aluminum according to a second embodiment of the present disclosure.

Referring to FIG. 8, a graph illustrates the resistivity of aluminum-doped zinc oxide as a function of weight percentage of aluminum according to a second embodiment of the present disclosure. The resistivity of aluminum-doped zinc oxide depends on the dopant concentration of aluminum. A high concentration of aluminum decreases resistivity of aluminum-doped zinc oxide, and shifts the Fermi level close to the conduction band edge. Conversely, a low concentration of aluminum increases resistivity of aluminum-doped zinc oxide, and shifts the Fermi level away from the conduction band toward the mid-gap level, i.e., the energy level midway between the valence band edge and the conduction band edge.

In case aluminum-doped zinc oxide is employed for the transparent conductive material layer 120 in the prior art photovoltaic device structure of FIG. 1, the concentration of aluminum in the transparent conductive material layer 120 is constant. A homogeneous heavily-aluminum-doped zinc oxide layer may be employed for the transparent conductive material layer 120 in the prior art photovoltaic device structure of FIG. 1. On the one hand, if a heavily-aluminum-doped zinc oxide layer contacts a p-doped semiconductor layer 30, the presence of the Fermi level close to the conduction band edge of the heavily-aluminum-doped zinc oxide layer causes significant the band bending in the p-doped semiconductor layer 30, and the Schottky barrier between the p-doped semiconductor layer 30 and the heavily-aluminum-doped zinc oxide layer. At the same time, the low resistivity of the heavily-aluminum-doped zinc oxide layer reduces internal resistance of the photovoltaic device structure that includes the heavily-aluminum-doped zinc oxide layer. On the other hand, if a lightly-aluminum-doped zinc oxide layer contacts a p-doped semiconductor layer 30, the presence of the Fermi level close to the middle of the band gap of the lightly-aluminum-doped zinc oxide layer reduces the band bending in the p-doped semiconductor layer 30 relative to the band bending in the case of a heavily-aluminum-doped zinc oxide layer. The Schottky barrier between the p-doped semiconductor layer 30 and the lightly-aluminum-doped zinc oxide layer is correspondingly decreased. However, the high resistivity of the lightly-aluminum-doped zinc oxide layer increases internal resistance of the photovoltaic device structure that includes the heavily-aluminum-doped zinc oxide layer. The thickness of the Schottky-barrier-reducing layer 22 can be from 1 nm to 10 nm in this case. When lightly-aluminum-doped zinc oxide is located at the interface between p-type semiconductor and heavily-aluminum-doped zinc oxide, the lightly-aluminum-doped zinc oxide reduces Schottky barrier heights and heavily-aluminum-doped zinc oxide reduces sheet resistance of entire zinc oxide stacks.

In one example of the second embodiment, the transparent conductive material layer 20 includes an aluminum-doped zinc oxide having an aluminum doping at a first dopant concentration, and the Schottky-barrier-reducing layer 22 includes an aluminum-doped zinc oxide having an aluminum doping at a second dopant concentration. The first dopant concentration is greater than the second dopant concentration. The high aluminum concentration of the transparent conductive material layer 20 provides low internal resistance in the second exemplary photovoltaic device structure. At the same time, the low aluminum concentration of the Schottky-barrier-reducing layer 22 provides a low Schottky barrier, and correspondingly, a low contact resistance between the Schottky-barrier-reducing layer 22 and the p-doped semiconductor layer 30. In one example, the first dopant concentration is selected to be in the range from 2.0% atomic concentration or greater, and the second dopant concentration is selected to be in the range between 0% and 2.0%, although different ranges may be selected for the first and second dopant concentrations.

In case fluorine-doped tin oxide is employed for the transparent conductive material layer 120 in the prior art photovoltaic device structure of FIG. 1, the concentration of fluorine in the transparent conductive material layer 120 is constant. A homogeneous heavily-fluorine-doped tin oxide layer or a homogeneous lightly-fluorine-doped tin oxide layer may be employed for the transparent conductive material layer 120 in the prior art photovoltaic device structure of FIG. 1. On the one hand, if a heavily-fluorine-doped tin oxide layer contacts a p-doped semiconductor layer 30, the presence of the Fermi level close to the conduction band edge of the heavily-fluorine-doped tin oxide layer causes significant the band bending in the p-doped semiconductor layer 30, and the Schottky barrier between the p-doped semiconductor layer 30 and the heavily-fluorine-doped tin oxide layer. At the same time, the low resistivity of the heavily-fluorine-doped tin oxide layer reduces internal resistance of the photovoltaic device structure that includes the heavily-fluorine-doped tin oxide layer. On the other hand, if a lightly-fluorine-doped tin oxide layer contacts a p-doped semiconductor layer 30, the presence of the Fermi level close to the middle of the band gap of the lightly-fluorine-doped tin oxide layer reduces the band bending in the p-doped semiconductor layer 30 relative to the band bending in the case of a heavily-fluorine-doped tin oxide layer. The Schottky barrier between the p-doped semiconductor layer 30 and the lightly-fluorine-doped tin oxide layer is correspondingly decreased. However, the high resistivity of the lightly-fluorine-doped tin oxide layer increases internal resistance of the photovoltaic device structure that includes the heavily-fluorine-doped tin oxide layer. The thickness of the Schottky-barrier-reducing layer 22 can be from 1 nm to 50 in this case, although lesser and greater thicknesses can also be employed.

In another example of the second embodiment, the transparent conductive material layer 20 includes a fluorine-doped tin oxide having a fluorine doping at a first dopant concentration, and the Schottky-barrier-reducing layer 22 includes a fluorine-doped tin oxide having a fluorine doping at a second dopant concentration. The first dopant concentration is greater than the second dopant concentration. The high fluorine concentration of the transparent conductive material layer 20 provides low internal resistance in the second exemplary photovoltaic device structure. At the same time, the low fluorine concentration of the Schottky-barrier-reducing layer 22 provides a low Schottky barrier, and correspondingly, a low contact resistance between the Schottky-barrier-reducing layer 22 and the p-doped semiconductor layer 30. In one example, the first dopant concentration is selected to be in the range from 2.0% atomic concentration or greater, and the second dopant concentration is selected to be in the range between 0% and 2.0%, although different ranges may be selected for the first and second dopant concentrations.

In some cases, the Schottky-barrier-reducing layer 22 can include a material having a higher resistivity than a material of the transparent conductive material layer 20 if the conductivity of the Schottky-barrier-reducing layer 22 increases with the dopant concentration in the Schottky-barrier-reducing layer 22, i.e., if the resistivity of the Schottky-barrier-reducing layer 22 decreases with the dopant concentration in the Schottky-barrier-reducing layer 22.

Figure 9:
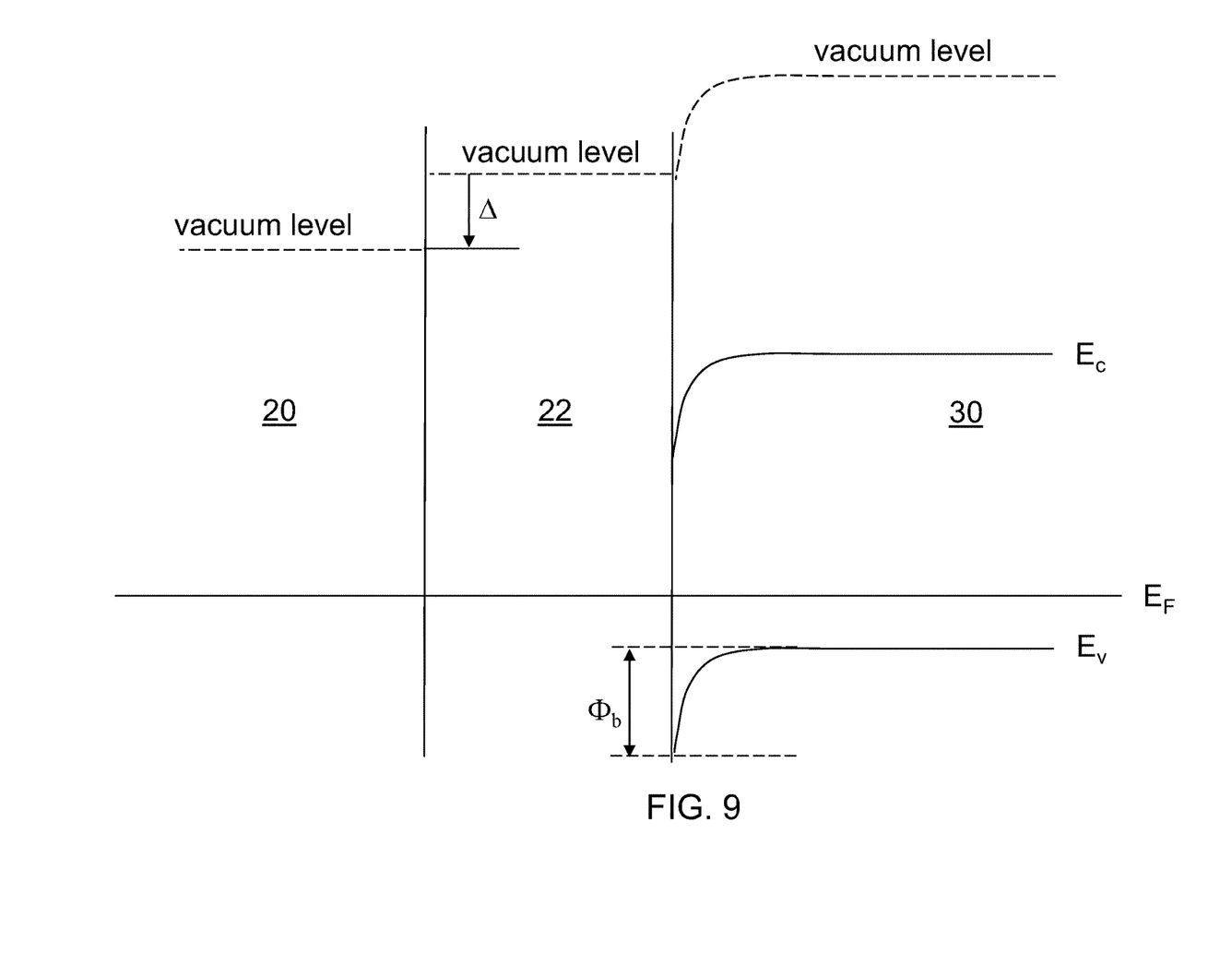
FIG. 9 is a band diagram for first and second exemplary photovoltaic device structures according to the first and second embodiments of the present disclosure.

Referring to FIG. 9, a band diagram for first and second exemplary photovoltaic devices structure illustrates the mechanism for according to the first and second embodiments of the present disclosure. The Schottly-barrier-reducing layer 22 has a work function that is greater than a work function of the transparent conductive material layer by a work function differential $\Delta$. The work function of the Schottly-barrier-reducing layer 22 is lesser than an absolute value of the Fermi level $E_F$ of the p-doped semiconductor layer 30, i.e., the energy difference between the vacuum level and the Fermi level energy $E_F$ for the p-doped semiconductor layer 30.

In the absence of the Schottky-barrier-reducing layer 22, a direct contact between a transparent conductive material layer and a p-doped semiconductor layer causes an energy barrier equivalent to $\Delta+\Phi_b$, i.e., the sum of the difference in the work functions of the transparent conductive material layer 20 and the Schottky-barrier-reducing layer 22 and the band bending $\Phi_b$ at the interface between the Schottky-barrier-reducing layer 22 and the p-doped semiconductor layer 30. Because the probability of finding a hole within the valence band of the p-doped semiconductor layer is determined by the Fermi-Dirac statistics, the probability of finding a hole in a surface region of the p-doped semiconductor layer 130 at the interface with the transparent conductive material layer 20 decreases almost exponentially with $\Delta+\Phi_b$. Thus, the Schottky barrier and the contact resistance are significant. In the present disclosure, the total energy barrier is broken into two separate barriers, each of which is less significant than a combined energy barrier. Consequently, the Schottky barrier and the contact resistance in the combined stack of the transparent conductive material layer 20, the Schottky-barrier-reducing layer 22, and the p-doped semiconductor layer 30 according to the first and second embodiments of the present disclosure are reduced compared to prior art.

Figure 10A:
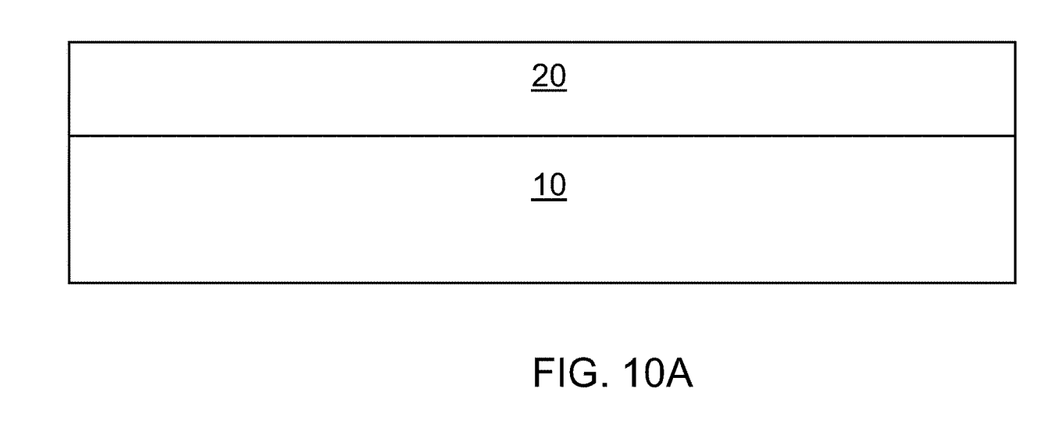
FIG. 10A is a vertical cross-sectional view of an exemplary photovoltaic device structure after formation of a transparent conductive material layer according to embodiments of the present invention.
Figure 10B:
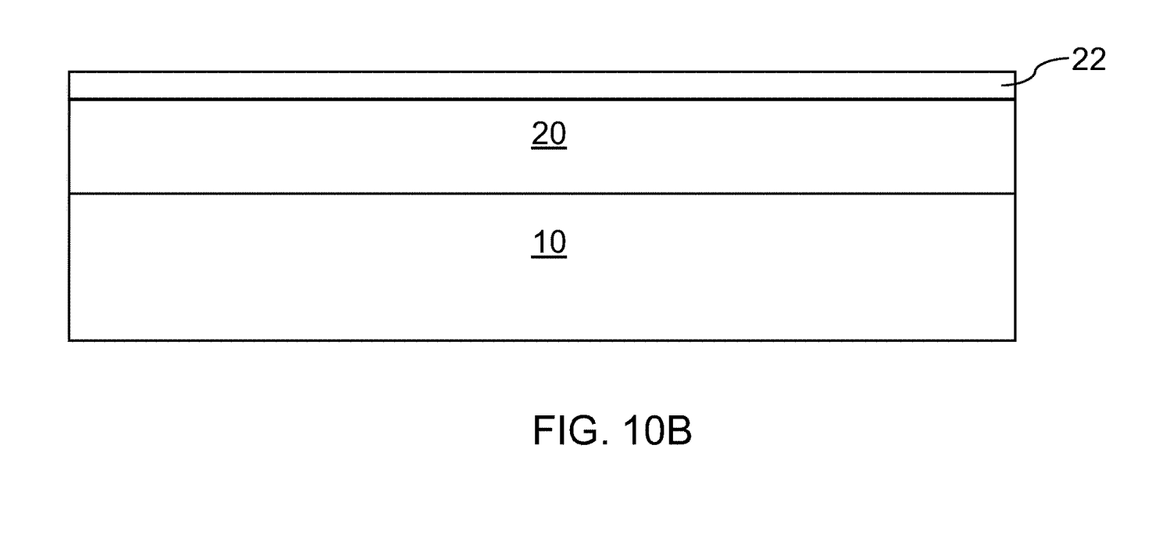
FIG. 10B is a vertical cross-sectional view of an exemplary photovoltaic device structure after formation of a p-doped semiconductor layer according to embodiments of the present invention.
Figure 10C:
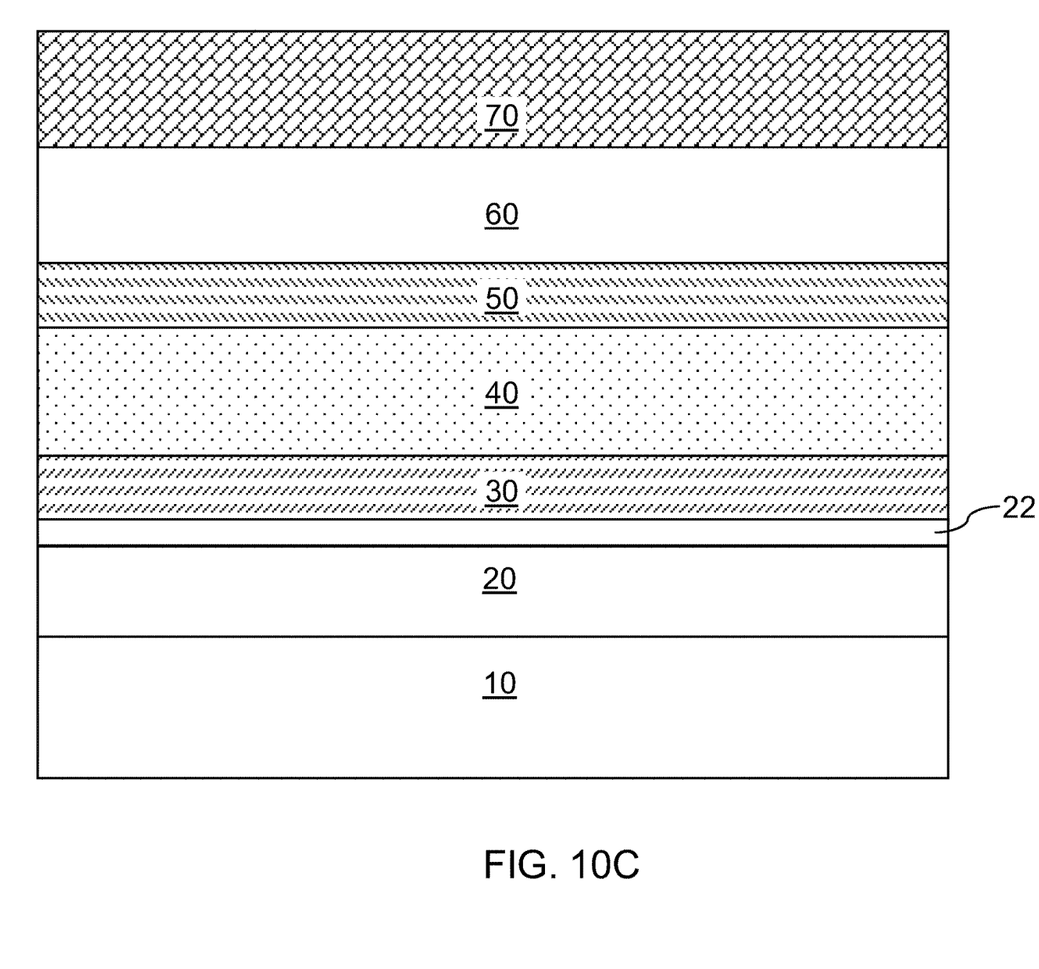
FIG. 10C is a vertical cross-sectional view of an exemplary photovoltaic device structure after formation of back reflector layers according to embodiments of the present invention.

FIG. 10A-10C are sequential vertical cross-sectional views that illustrate a manufacturing process for forming the exemplary photovoltaic device structure of FIG. 6. Referring to FIG. 10A, the substrate 10 includes a material that is transparent in the range of electromagnetic radiation at which photogeneration of electrons and holes occur within the photovoltaic structure as describe above. The transparent conductive material layer 20 is formed on the substrate 10, for example, by deposition.

Referring to FIG. 10B, the Schottky-barrier-reducing layer 22 is deposited for example, by chemical vapor deposition, evaporation, or any other known methods of deposition. In case the Schottky-barrier-reducing layer 22 includes an allotrope of carbon, methods known in the art for forming such an allotrope of carbon can be employed. In case the Schottky-barrier-reducing layer 22 includes a transparent conductive material having a different dopant concentration than the transparent conductive material layer 20, methods for forming the transparent conductive material layer 20 can be modified to alter the dopant concentration in the Schottky-barrier-reducing layer 22.

Referring to FIG. 10C, the p-doped semiconductor layer 30 is deposited in a process chamber containing a semiconductor-material-containing reactant gas and a carrier gas. The p-doped semiconductor layer 30 is formed on the Schottky-barrier-reducing layer 22 in the presence of the semiconductor-material-containing reactant and the carrier gas in a chemical vapor deposition. In case the carrier gas includes hydrogen, the p-doped semiconductor layer 30 includes a hydrogenated p-doped semiconductor material. The chemical vapor deposition process can be plasma enhanced chemical vapor process (PECVD) performed at a deposition temperature from 50° C. to 400° C., and preferably from 100° C. to 350° C., and at a pressure from 0.1 Torr to 10 Torr, and preferably from 0.2 Torr to 5 Torr.

The semiconductor-material-containing reactant gas includes at least one atom of silicon, germanium, or a component semiconductor material of a compound semiconductor material such as GaAs. The p-type dopants in the p-doped semiconductor-containing material of the p-doped semiconductor layer 30 can be introduced by in-situ doping. Alternately, the p-type dopants in the microcrystalline p-doped hydrogenated semiconductor-containing material can be introduced by subsequent introduction of dopants employing any method known in the art such as plasma doping, ion implantation, and/or outdiffusion from a disposable diffusion source (e.g., borosilicate glass).

The material of the p-doped semiconductor layer 30 can be a p-doped hydrogenated silicon-carbon alloy. In this case, a carbon-containing gas can be flown into the processing chamber during deposition of the p-doped hydrogenated silicon-carbon alloy.

Subsequently, the intrinsic semiconductor layer 40 is deposited on the p-doped semiconductor layer 30, for example, by plasma-enhanced chemical vapor deposition. In case the intrinsic semiconductor layer 40 includes an intrinsic hydrogenated semiconductor-containing material, hydrogen gas is supplied into the process chamber concurrently with a semiconductor-material-containing reactant gas. The intrinsic hydrogenated semiconductor-containing material can be amorphous or microcrystalline.

The n-doped semiconductor layer 50 is deposited on the intrinsic semiconductor layer 40, for example, by plasma-enhanced chemical vapor deposition. In case the n-doped semiconductor layer 50 includes an n-doped hydrogenated semiconductor-containing material, hydrogen gas is supplied into the process chamber concurrently with a semiconductor-material-containing reactant gas. The material of the n-doped semiconductor layer 50 can be amorphous or microcrystalline.

The n-type dopants in the n-doped semiconductor layer 50 can be introduced by in-situ doping. For example, phosphine ($PH_3$) gas or arsine ($AsH_3$) gas can be flown into the processing chamber concurrently with the semiconductor-material-containing reactant gas if the n-doped semiconductor layer 50 includes an n-doped silicon-containing material or an n-doped germanium-containing material. If the n-doped semiconductor layer 50 includes an n-doped compound semiconductor material, the ratio of the flow rate of the reactant gas for the Group II or Group III material to the flow rate of the reactant gas for the group VI or Group V material can be decreased to induce n-type doping. Alternately, the n-type dopants in the n-doped semiconductor layer 50 can be introduced by subsequent introduction of dopants employing any method known in the art.

The first back reflector layer 60 is deposited on the n-doped semiconductor layer 50 employing methods known in the art. The first back reflector layer 60 includes a transparent conductive material. The second back reflector layer 70 is subsequently deposited on the first back reflector layer 70, for example, by electroplating, electroless plating, physical vapor deposition, chemical vapor deposition, vacuum evaporation, or a combination thereof. The second back reflector layer 70 can be a metallic layer.

While the present disclosure has been particularly shown and described with respect to preferred embodiments thereof, it will be understood by those skilled in the art that the foregoing and other changes in forms and details can be made without departing from the spirit and scope of the present disclosure. It is therefore intended that the present disclosure not be limited to the exact forms and details described and illustrated, but fall within the scope of the appended claims.

What is claimed is:

1. A photovoltaic device comprising a stack, from one side to another side, of:
   a transparent conductive material layer;
   a Schottky-barrier-reducing layer contacting said transparent conductive material layer, wherein said Schottky-barrier-reducing layer is an optically transparent layer consisting essentially of single wall carbon nanotubes; and
   a p-doped semiconductor layer, wherein a Schottky barrier across said stack has a lower contact resistance than a Schottky barrier across a comparative exemplary stack that includes all layers of said stack less said Schottky-barrier-reducing layer, and wherein said Schottky-barrier-reducing layer is in direct contact with said p-doped semiconductor layer;
   an intrinsic semiconductor layer contacting said p-doped semiconductor layer;
   an n-doped semiconductor layer directly on said intrinsic semiconductor layer; and
   a back reflector layer in direct contact with said n-doped semiconductor layer.

2. The photovoltaic device of claim 1, wherein the p-doped semiconductor layer comprises a p-doped silicon material.

3. The photovoltaic device of claim 1, wherein said intrinsic semiconductor layer includes a hydrogenated amorphous intrinsic semiconductor material.

4. The photovoltaic device of claim 1, wherein said n-doped semiconductor layer includes hydrogenated n-doped amorphous semiconductor material.

5. The photovoltaic device of claim 1, further comprising a metallic back reflector layer located on said back reflector layer.

6. The photovoltaic device of claim 1, wherein said Schottly-barrier-reducing layer has a work function that is greater than a work function of said transparent conductive material layer and is lesser than an absolute value of a Fermi level of said p-doped semiconductor layer.

7. The photovoltaic device of claim 1, wherein a series resistance of said photovoltaic device is equal to or less than 9 Ohms-cm$^2$.

8. The photovoltaic device of claim 1, wherein said p-doped semiconductor layer includes a hydrogenated p-doped semiconductor-containing material.

9. The photovoltaic device of claim 1, wherein said transparent conductive material layer comprises aluminum-doped zinc oxide having an aluminum doping at a first dopant concentration.

10. The photovoltaic device of claim 1, wherein said transparent conductive material layer comprises fluorine-doped tin oxide having an fluorine doping at a first dopant concentration.

11. The photovoltaic device of claim 1, wherein said back reflector layer is optically transparent and comprises n-type materials.

12. The photovoltaic device of claim 1, wherein said back reflector layer comprises an optically transparent conductive oxide selected from the group consisting of a fluorine-doped tin oxide, an aluminum-doped zinc oxide and an indium tin oxide.

13. The photovoltaic device of claim 1, wherein a series resistance of said photovoltaic device is 2 Ohms-cm$^2$.

* * * * *